(12) United States Patent
Henley et al.

(10) Patent No.: US 8,330,126 B2
(45) Date of Patent: Dec. 11, 2012

(54) RACE TRACK CONFIGURATION AND METHOD FOR WAFERING SILICON SOLAR SUBSTRATES

(75) Inventors: Francois J. Henley, Aptos, CA (US); Adam Brailove, San Jose, CA (US)

(73) Assignee: Silicon Genesis Corporation, San Jose, CA (US)

( * ) Notice: Subject to any disclaimer, the term of this patent is extended or adjusted under 35 U.S.C. 154(b) by 664 days.

(21) Appl. No.: 12/462,210

(22) Filed: Jul. 29, 2009

(65) Prior Publication Data
US 2010/0044595 A1    Feb. 25, 2010

Related U.S. Application Data

(60) Provisional application No. 61/091,710, filed on Aug. 25, 2008.

(51) Int. Cl.
*H01L 31/00* (2006.01)

(52) U.S. Cl. ............. 250/492.2; 250/492.1; 250/492.21; 250/492.22; 250/492.3

(58) Field of Classification Search ..... 250/492.1–492.3
See application file for complete search history.

(56) References Cited

U.S. PATENT DOCUMENTS

| | | |
|---|---|---|
| 2,614,055 A | 10/1952 | Senarelens |
| 3,117,002 A | 1/1964 | Bronson et al. |
| 3,225,820 A | 12/1965 | Riordan |
| 3,390,033 A | 6/1968 | Brown |
| 3,392,069 A | 7/1968 | Merkel et al. |
| 3,551,213 A | 12/1970 | Boyle |
| 3,770,499 A | 11/1973 | Crowe et al. |
| 3,786,359 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |

(Continued)

FOREIGN PATENT DOCUMENTS
DE          834363          3/1952
(Continued)

OTHER PUBLICATIONS

Adan et al., SOI as a mainstream IC technology Proceedings 1998 IEEE International SOI conference, Oct. 1998, pp. 9-12.

(Continued)

*Primary Examiner* — Michael Maskell
(74) *Attorney, Agent, or Firm* — Kilpatrick Townsend & Stockton LLP (57) ABSTRACT

A system for manufacturing free-standing films from work pieces. The system includes a racetrack structure being configured to transfer at least one work piece and one or more accelerator-based ion implanters coupled to the racetrack structure via an end station. Each of the accelerator-based ion implanters is configured to introduce particles having an energy of greater than 1 MeV to implant into a surface of the work piece loaded in the end station to form a cleave region in the work piece. The system includes one or more cleave modules coupled to the racetrack structure configured to perform a cleave process to release a free-standing film from the work piece along the cleave region. Additionally, the system includes an output port coupled to each cleave module to output the free standing film detached from the work piece and one or more service modules each connected to the racetrack structure.

23 Claims, 5 Drawing Sheets

U.S. PATENT DOCUMENTS

| | | | |
|---|---|---|---|
| 3,915,757 A | 10/1975 | Engel | |
| 3,946,334 A | 3/1976 | Yonezu | |
| 3,957,107 A | 5/1976 | Alotz et al. | |
| 3,964,957 A | 6/1976 | Walsk | |
| 3,993,909 A | 11/1976 | Drews et al. | |
| 4,006,340 A | 2/1977 | Gorinas | |
| 4,039,416 A | 8/1977 | White | |
| 4,053,335 A | 10/1977 | Hu | |
| 4,074,139 A | 2/1978 | Pankove | |
| 4,107,350 A | 8/1978 | Berg et al. | |
| 4,108,751 A | 8/1978 | King | |
| 4,116,751 A | 9/1978 | Zaromb | |
| 4,121,334 A | 10/1978 | Wallis | |
| 4,170,662 A | 10/1979 | Weiss et al. | |
| 4,216,906 A | 8/1980 | Olsen et al. | |
| 4,237,601 A | 12/1980 | Woolhouse et al. | |
| 4,244,348 A | 1/1981 | Wilkes | |
| 4,252,837 A | 2/1981 | Auton | |
| 4,255,208 A | 3/1981 | Deutscher et al. | |
| 4,274,004 A | 6/1981 | Kanai | |
| 4,342,631 A | 8/1982 | White et al. | |
| 4,346,123 A | 8/1982 | Kaufmann | |
| 4,361,600 A | 11/1982 | Brown | |
| 4,368,083 A | 1/1983 | Bruel et al. | |
| 4,375,125 A | 3/1983 | Byatt | |
| 4,412,868 A | 11/1983 | Brown et al. | |
| 4,452,644 A | 6/1984 | Bruel et al. | |
| 4,468,309 A | 8/1984 | White | |
| 4,471,003 A | 9/1984 | Cann | |
| 4,486,247 A | 12/1984 | Ecer et al. | |
| 4,490,190 A | 12/1984 | Speri | |
| 4,495,219 A | 1/1985 | Kato et al. | |
| 4,500,563 A | 2/1985 | Ellenberger et al. | |
| 4,508,056 A | 4/1985 | Bruel et al. | |
| 4,530,149 A | 7/1985 | Jastrzebski et al. | |
| 4,536,657 A | 8/1985 | Bruel | |
| 4,539,050 A | 9/1985 | Kramler et al. | |
| 4,566,403 A | 1/1986 | Fournier | |
| 4,567,505 A | 1/1986 | Pease et al. | |
| 4,568,563 A | 2/1986 | Jackson et al. | |
| 4,585,945 A | 4/1986 | Bruel et al. | |
| 4,645,546 A | 2/1987 | Matsushita | |
| 4,684,535 A | 8/1987 | Heinecke et al. | |
| 4,704,302 A | 11/1987 | Bruel et al. | |
| 4,706,377 A | 11/1987 | Shuskus | |
| 4,717,683 A | 1/1988 | Parillo | |
| 4,727,047 A | 2/1988 | Bozler et al. | |
| 4,764,394 A | 8/1988 | Conrad | |
| 4,766,086 A | 8/1988 | Oshima et al. | |
| 4,837,172 A | 6/1989 | Mizuno et al. | |
| 4,846,928 A | 7/1989 | Dolins et al. | |
| 4,847,792 A | 7/1989 | Barna et al. | |
| 4,853,250 A | 8/1989 | Boulos et al. | |
| 4,883,561 A | 11/1989 | Gmitter et al. | |
| 4,887,005 A | 12/1989 | Rough et al. | |
| 4,891,329 A | 1/1990 | Reismann et al. | |
| 4,894,709 A | 1/1990 | Phillips et al. | |
| 4,906,594 A | 3/1990 | Yoneda | |
| 4,931,405 A | 6/1990 | Kamijo et al. | |
| 4,948,458 A | 8/1990 | Ogle | |
| 4,952,273 A | 8/1990 | Popov | |
| 4,956,693 A | 9/1990 | Sawahata et al. | |
| 4,960,073 A | 10/1990 | Suzuki et al. | |
| 4,982,090 A | 1/1991 | Wittmaack | |
| 4,983,251 A | 1/1991 | Haisma et al. | |
| 4,996,077 A | 2/1991 | Moslehi et al. | |
| 5,015,353 A | 5/1991 | Hubler et al. | |
| 5,034,343 A | 7/1991 | Rouse et al. | |
| 5,070,040 A | 12/1991 | Pankove | |
| 5,082,793 A | 1/1992 | Li | |
| 5,102,821 A | 4/1992 | Moslehi | |
| 5,110,748 A | 5/1992 | Sarma | |
| 5,133,826 A | 7/1992 | Dandl | |
| 5,141,878 A | 8/1992 | Benton et al. | |
| 5,162,241 A | 11/1992 | Mori et al. | |
| 5,196,355 A | 3/1993 | Wittkower | |
| 5,198,071 A | 3/1993 | Scudder et al. | |
| 5,198,371 A | 3/1993 | Li | |
| 5,202,095 A | 4/1993 | Houchin et al. | |
| 5,203,960 A | 4/1993 | Dandl | |
| 5,206,749 A | 4/1993 | Zavracky et al. | |
| 5,213,451 A | 5/1993 | Frank | |
| 5,213,986 A | 5/1993 | Pinker et al. | |
| 5,234,529 A | 8/1993 | Johnson | |
| 5,234,535 A | 8/1993 | Beyer et al. | |
| 5,242,861 A | 9/1993 | Inaba | |
| 5,250,328 A | 10/1993 | Otto | |
| 5,252,178 A | 10/1993 | Moslehi | |
| 5,256,562 A | 10/1993 | Vu et al. | |
| 5,258,320 A | 11/1993 | Zavracky et al. | |
| 5,258,325 A | 11/1993 | Spitzer et al. | |
| 5,269,880 A | 12/1993 | Jolly et al. | |
| 5,273,610 A | 12/1993 | Thomas, III et al. | |
| 5,277,748 A | 1/1994 | Sakaguchi et al. | |
| 5,303,574 A | 4/1994 | Matossian et al. | |
| 5,304,509 A | 4/1994 | Sopori | |
| 5,308,776 A | 5/1994 | Gotou | |
| 5,317,236 A | 5/1994 | Zavracky et al. | |
| 5,342,472 A | 8/1994 | Imahashi et al. | |
| 5,344,524 A | 9/1994 | Sharma et al. | |
| 5,354,381 A | 10/1994 | Sheng | |
| 5,362,671 A | 11/1994 | Zavracky et al. | |
| 5,363,603 A | 11/1994 | Miller et al. | |
| 5,368,710 A | 11/1994 | Chen et al. | |
| 5,370,765 A | 12/1994 | Dandl | |
| 5,374,564 A | 12/1994 | Bruel | |
| 5,376,560 A | 12/1994 | Aronowitz et al. | |
| 5,377,031 A | 12/1994 | Vu et al. | |
| 5,403,434 A | 4/1995 | Moslehi | |
| 5,404,079 A | 4/1995 | Ohkuni et al. | |
| 5,405,480 A | 4/1995 | Benzing et al. | |
| 5,409,563 A | 4/1995 | Cathey | |
| 5,411,592 A | 5/1995 | Ovshinsky et al. | |
| 5,413,679 A | 5/1995 | Godbey | |
| 5,427,052 A | 6/1995 | Ohta et al. | |
| 5,435,880 A | 7/1995 | Minato et al. | |
| 5,438,241 A | 8/1995 | Zavracky et al. | |
| 5,443,661 A | 8/1995 | Oguro et al. | |
| 5,444,557 A | 8/1995 | Spitzer et al. | |
| 5,459,016 A | 10/1995 | Debe et al. | |
| 5,475,514 A | 12/1995 | Salerno et al. | |
| 5,476,691 A | 12/1995 | Komvopoulos et al. | |
| 5,480,842 A | 1/1996 | Clifton et al. | |
| 5,487,785 A | 1/1996 | Horiike et al. | |
| 5,494,835 A | 2/1996 | Bruel | |
| 5,504,328 A | 4/1996 | Bonser | |
| 5,506,176 A | 4/1996 | Takizawa | |
| 5,508,207 A | 4/1996 | Horai et al. | |
| 5,514,235 A | 5/1996 | Mitani et al. | |
| 5,518,965 A | 5/1996 | Menigaux | |
| 5,528,397 A | 6/1996 | Zavracky et al. | |
| 5,539,245 A | 7/1996 | Imura et al. | |
| 5,558,718 A | 9/1996 | Leung | |
| 5,559,043 A | 9/1996 | Bruel | |
| 5,569,620 A | 10/1996 | Linn et al. | |
| 5,581,385 A | 12/1996 | Spitzer et al. | |
| 5,585,304 A | 12/1996 | Hayashi et al. | |
| 5,611,855 A | 3/1997 | Wijaranakula | |
| 5,643,834 A | 7/1997 | Harada et al. | |
| 5,653,811 A | 8/1997 | Chan | |
| 5,686,980 A | 11/1997 | Hirayama et al. | |
| 5,700,333 A | 12/1997 | Yamazaki et al. | |
| 5,705,421 A | 1/1998 | Matsushita et al. | |
| 5,710,057 A | 1/1998 | Kenney | |
| 5,714,395 A | 2/1998 | Bruel | |
| 5,744,852 A | 4/1998 | Linn et al. | |
| 5,753,560 A | 5/1998 | Hong et al. | |
| 5,755,914 A | 5/1998 | Yonehara | |
| 5,763,319 A | 6/1998 | Ling et al. | |
| 5,783,022 A | 7/1998 | Cha et al. | |
| 5,793,913 A | 8/1998 | Kovacic | |
| 5,804,086 A | 9/1998 | Bruel | |
| 5,811,348 A | 9/1998 | Matsushita et al. | |
| 5,821,158 A | 10/1998 | Shishiguchi | |
| 5,824,595 A | 10/1998 | Igel et al. | |
| 5,827,751 A | 10/1998 | Nuyen | |
| 5,840,590 A | 11/1998 | Nuyen | |

| | | |
|---|---|---|
| 5,841,931 A | 11/1998 | Foresi |
| 5,854,123 A | 12/1998 | Sato et al. |
| 5,863,830 A | 1/1999 | Bruel et al. |
| 5,869,387 A | 2/1999 | Sato et al. |
| 5,869,405 A | 2/1999 | Gonzalez et al. |
| 5,877,070 A | 3/1999 | Goesele et al. |
| 5,882,987 A | 3/1999 | Srikrishnan |
| 5,897,743 A | 4/1999 | Fujimoto et al. |
| 5,906,951 A | 5/1999 | Chu et al. |
| 5,909,627 A | 6/1999 | Egloff |
| 5,920,764 A | 7/1999 | Hanson et al. |
| 5,942,050 A | 8/1999 | Green et al. |
| 5,953,622 A | 9/1999 | Lee et al. |
| 5,966,620 A | 10/1999 | Sakaguchi et al. |
| 5,966,625 A | 10/1999 | Zhong et al. |
| 5,968,279 A | 10/1999 | MacLeish et al. |
| 5,985,742 A | 11/1999 | Henley et al. |
| 5,993,677 A | 11/1999 | Biasse et al. |
| 5,994,207 A | 11/1999 | Henley et al. |
| 6,004,868 A | 12/1999 | Rolfson et al. |
| 6,008,128 A | 12/1999 | Habuka et al. |
| 6,010,579 A * | 1/2000 | Henley et al. .................. 148/33.2 |
| 6,013,563 A | 1/2000 | Henley et al. |
| 6,013,567 A | 1/2000 | Henley et al. |
| 6,020,252 A | 2/2000 | Aspar et al. |
| 6,027,988 A | 2/2000 | Cheung et al. |
| 6,033,974 A | 3/2000 | Henley et al. |
| 6,048,411 A | 4/2000 | Henley et al. |
| 6,066,915 A | 5/2000 | Pepi |
| 6,077,383 A | 6/2000 | Laporte |
| 6,083,324 A | 7/2000 | Henley et al. |
| 6,103,599 A | 8/2000 | Henley et al. |
| 6,107,213 A | 8/2000 | Tayanaka |
| 6,107,653 A | 8/2000 | Fitzgerald |
| 6,120,597 A | 9/2000 | Levy et al. |
| 6,143,628 A | 11/2000 | Sato et al. |
| 6,150,239 A | 11/2000 | Goesele et al. |
| 6,159,824 A | 12/2000 | Henley et al. |
| 6,162,705 A | 12/2000 | Henley et al. |
| 6,171,965 B1 | 1/2001 | Kang |
| 6,171,982 B1 | 1/2001 | Sato |
| 6,184,111 B1 | 2/2001 | Henley et al. |
| 6,190,998 B1 | 2/2001 | Bruel et al. |
| 6,191,007 B1 | 2/2001 | Matsui et al. |
| 6,194,327 B1 | 2/2001 | Gonzalez et al. |
| 6,204,151 B1 | 3/2001 | Malik et al. |
| 6,214,701 B1 | 4/2001 | Matsushita et al. |
| 6,225,192 B1 | 5/2001 | Aspar et al. |
| 6,251,754 B1 | 6/2001 | Ohshima et al. |
| 6,263,941 B1 | 7/2001 | Bryan et al. |
| 6,274,464 B2 | 8/2001 | Drobny et al. |
| 6,287,941 B1 | 9/2001 | Kang et al. |
| 6,291,321 B1 | 9/2001 | Fitzgerald |
| 6,294,478 B1 | 9/2001 | Sakaguchi et al. |
| 6,335,269 B1 | 1/2002 | Sato |
| 6,342,436 B1 | 1/2002 | Takizawa |
| 6,376,806 B2 | 4/2002 | Yoo |
| 6,452,091 B1 | 9/2002 | Nakagawa et al. |
| 6,455,397 B1 | 9/2002 | Belford |
| 6,455,399 B2 | 9/2002 | Malik et al. |
| 6,503,773 B2 | 1/2003 | Fitzgerald |
| 6,513,564 B2 | 2/2003 | Bryan et al. |
| 6,514,836 B2 | 2/2003 | Belford |
| 6,534,381 B2 | 3/2003 | Cheung et al. |
| 6,563,152 B2 | 5/2003 | Roberts et al. |
| 6,621,131 B2 | 9/2003 | Murthy et al. |
| 6,723,661 B2 | 4/2004 | Fitzergald |
| 6,809,009 B2 | 10/2004 | Aspar et al. |
| 6,858,107 B2 | 2/2005 | Ghyselen et al. |
| 6,911,376 B2 | 6/2005 | Yoo |
| 6,969,668 B1 | 11/2005 | Kang et al. |
| 7,019,339 B2 | 3/2006 | Atwater |
| 7,354,815 B2 | 4/2008 | Henley |
| 8,088,669 B2 * | 1/2012 | Yamazaki .................... 438/458 |
| 2001/0019371 A1 | 9/2001 | Zavracky et al. |
| 2001/0039095 A1 | 11/2001 | Marty |
| 2002/0174828 A1 | 11/2002 | Vasat et al. |
| 2003/0077885 A1 | 4/2003 | Aspar et al. |
| 2003/0096098 A1 | 5/2003 | Ovshinsky et al. |
| 2003/0140844 A1 | 7/2003 | Maa et al. |
| 2003/0186493 A1 | 10/2003 | Iwasaki et al. |
| 2004/0253794 A1 | 12/2004 | Faris |
| 2005/0118754 A1 | 6/2005 | Henley et al. |
| 2005/0189013 A1 | 9/2005 | Hartley |
| 2006/0014366 A1 | 1/2006 | Currie |
| 2006/0030122 A1 | 2/2006 | Shimoda et al. |
| 2006/0038182 A1 | 2/2006 | Rogers et al. |
| 2011/0121207 A1 * | 5/2011 | Brailove .................. 250/492.21 |

FOREIGN PATENT DOCUMENTS

| | | |
|---|---|---|
| DE | 19753494 | 10/1998 |
| EP | 084287 A1 | 7/1983 |
| EP | 099778 A1 | 2/1984 |
| EP | 155875 A1 | 2/1984 |
| EP | 112238 A2 | 6/1984 |
| EP | 181249 A1 | 5/1986 |
| EP | 112230 A1 | 4/1987 |
| EP | 0296804 | 12/1988 |
| EP | 164281 A1 | 2/1989 |
| EP | 355913 A1 | 2/1990 |
| EP | 379828 | 8/1990 |
| EP | 459177 | 12/1991 |
| EP | 504714 A2 | 9/1992 |
| EP | 533551 A1 | 3/1993 |
| EP | 0553852 | 8/1993 |
| EP | 660140 A1 | 6/1995 |
| EP | 665587 A1 | 8/1995 |
| EP | 0665588 A1 | 8/1995 |
| EP | 703609 A1 | 3/1996 |
| EP | 763849 A1 | 3/1997 |
| EP | 0807970 | 11/1997 |
| EP | 0843344 | 5/1998 |
| EP | 867917 A2 | 9/1998 |
| EP | 867921 A2 | 9/1998 |
| EP | 0905767 | 3/1999 |
| EP | 961312 A2 | 12/1999 |
| EP | 0971395 | 1/2000 |
| EP | 1085562 | 3/2001 |
| FR | 1558881 | 2/1969 |
| FR | 2235474 A1 | 1/1975 |
| FR | 2261802 A1 | 9/1975 |
| FR | 2266304 A | 10/1975 |
| FR | 2298880 A1 | 8/1976 |
| FR | 2519437 A1 | 7/1983 |
| FR | 2529383 A1 | 12/1983 |
| FR | 2575601 A1 | 7/1984 |
| FR | 2537768 A1 | 8/1985 |
| FR | 2560426 A1 | 8/1985 |
| FR | 2563377 A1 | 10/1985 |
| FR | 2537777 A1 | 4/1986 |
| FR | 2681472 A1 | 3/1993 |
| FR | 2714524 A1 | 6/1995 |
| FR | 2715501 A1 | 7/1995 |
| FR | 2715502 A1 | 7/1995 |
| FR | 2715503 | 7/1995 |
| FR | 2720189 A1 | 11/1995 |
| FR | 2725074 A1 | 3/1996 |
| GB | 2221991 A | 7/1989 |
| GB | 2231197 A | 11/1990 |
| JP | 53-104156 A | 9/1978 |
| JP | 58-030145 | 2/1983 |
| JP | 58-144475 A | 8/1983 |
| JP | 59-046750 A | 3/1984 |
| JP | 59-054217 A | 3/1984 |
| JP | 59-114744 A | 7/1984 |
| JP | 59-139539 | 8/1984 |
| JP | 59-193904 | 11/1984 |
| JP | 60-207237 A | 10/1985 |
| JP | 60-235434 A2 | 11/1985 |
| JP | 61-125012 | 6/1986 |
| JP | 3-109731 A | 5/1991 |
| JP | 3-132055 A | 6/1991 |
| JP | 3-265156 A | 11/1991 |
| JP | 4-076503 | 3/1992 |
| JP | 4-246594 A | 9/1992 |
| JP | 4-298023 A | 10/1992 |
| JP | 5-211128 A | 8/1993 |
| JP | 5-218053 | 8/1993 |

| | | |
|---|---|---|
| JP | 7-164728 | 6/1995 |
| JP | 7-215800 A | 8/1995 |
| JP | 7-254690 A | 10/1995 |
| JP | 7-263291 A | 10/1995 |
| JP | 8-097389 A | 4/1996 |
| JP | 10-200080 A | 7/1998 |
| JP | 10-275905 | 10/1998 |
| jp | 11-045840 A | 2/1999 |
| JP | 2901031 B2 | 6/1999 |
| JP | 2910001 B2 | 6/1999 |
| JP | 2000-94317 A | 4/2000 |
| WO | WO 9510718 A1 | 4/1995 |
| WO | WO 9520824 A1 | 8/1995 |
| WO | WO 9531825 A1 | 11/1995 |
| WO | WO 9935674 A1 | 7/1999 |
| WO | WO 0063965 | 10/2000 |
| WO | WO 0154175 | 7/2001 |

OTHER PUBLICATIONS

Alles et al., Thin Film Silicon on Insulator: An Enabling Technology, Semiconductor International, pp. 67-72 (1997).
Auberton-Herve, "SOI: Materials to Systems", International Electron Devices Meeting, 1996, San Francisco, CA, USA, Dec. 8-11, 1996, New York, NY, USA, IEEE, US, Dec. 8, 1996, pp. 3-10.
Basta, Ion-Beam Implantation, High Technology (1985).
Belford et al., Performance-Augmented CMOS using Back-end Uni axial Strain 2002 Device Research Conference, Santa Barbara, CA.
Brendel, A Novel Process for Ultrathin Monocrystalline Silicon Solar Cells on Glass, 14th European Photovoltaic Solar Energy Conference Barcelona, Spain, Jun. 30-Jul. 4, 1997.
Burggraff, Advanced Plasma Source: What's Working?, Semiconductor International, pp. 56-59 (May 1994).
Carter et al., "The Collection of IONS Implanted in Semiconductors II. Range distributions Derived from Collection and Sputter-Etch Curves," Radiation Effects, vol. 16, pp. 107-114 (1972).
Cassidy, Ion Implantation Process Toughens Metalworking Tools, Modern Metals, pp. 65-67 (1984).
Centura EPI "Epitaxial Deposition Chamber Specifications" Brochure, Applied Materials, Mar. 1994.
Cheung, Plasma Immersion Ion Implantation for Semiconductor Processing, Material Chemistry and Physics, 46(2-3): 132-139 (1996).
Cho et al., "Vapor Etching of Silicon Substrates with HCl Gas" Journal of the Korean Institute of Electronic Engineering, Apr. 25, 1984, pp. 41-45, vol. 21, No. 5.
Choyke et al., A Comparative Study of Near-Surface Effects Due to Very High Fluence H+ Implantation in Single Crystal FZ, CZ, and Web SI, Mat. Res. Soc. Symp. Proc., 27:359-364 (1984).
Choyke et al., Implanted Hydrogen Effects at High Concentrations in Model Low Z Shielding Materials, J. Nuc. Mtrls., 122-23:1585-86 (1984).
Choyke et al., Mechanical Response of Single Crystal Si to Very High Fluence H+ Implantation, Nuc. Instr. Meth., 209-210:407-412 (1983).
Chuang et al., Design Considerations of SOI Digital CMOS VLSI, Proceedings 1998 IEEE International SOI Conference, Oct. 1998, pp. 5-8.
Chu et al., Plasma Immersion Ion Implantation—A Fledgling Technique for Semiconductor Processing, Materials Science and Engineering Reports: A Review Journal, R17(6-7): 207-280 (1996).
Chu et al., Recent Applications of Plasma Immersion Ion Implantation, Semiconductor International, pp. 165-172 (1996).
Chu, Synthesis of SOI Materials Using Plasma Immersion Ion Implantation, 1997 Mat. Res. Soc. Symp. Proc., 438:333-343 (1997).
Comita et al., Low Temperature Si and SiGe Epitaxy for sub 01.μm Technology, AMAT Conference Paper, Mar. 10, 2003.
Corbett et al., Embrittlement of Materials: Si(H) as a Model System, J. Nuc. Mtrls., 169: 179-184 (1989).
Deegan et al., Wavy and rough cracks in silicon. Center for Nonlinear Dynamics and Department of Physics, The University of Texas at Austin, Austin, Texas 78712, USA, Phys. Rev. E 67, 066209 (2003) [7 pages].

EPI CENTURA, Systems Specifications Brochure, Applied Materials, Oct. 1996.
European Patent Search Report for European Application No. 07016247.4, dated Apr. 24, 2008, 8 pages total.
European Patent Search Report for European Application No. 08153348.1, dated Jun. 3, 2008, 8 pages total.
Feijo et al., Pre stressing of Bonded Wafers, Proceedings of the First International Symposium on Semiconductor Wafer Bonding Science, Technology and Applications (Electrochemical Society, New York, 1992, v. 92.7, pp. 230-238.
Ge et al., Process-Strained Si (PSS) CMOS Technology Featuring 3D Strain Engineering, IEEE International Electron Devices Meeting, Washington, DC, Dec. 2003.
Grovernor, C.R.M., Microelectric Materials (1989), pp. 73-75.
Habuka et al., Change in Microroughness of a Silicon Surface during in Situ Cleaning Using HF and HCL Gases, Journal of the Electrochemical Society, Electrochemical Society, Manchester, NY, v. 145, No. 12, Dec. 1998, pp. 4264-4271.
Hobart et al., "Fabrication of SOI Substrates with Ultra-Thin Si Layers" Electronics Letters, IEE Stevenage, GB, vol. 34, No. 12, Jun. 11, 1998, pp. 1265-1267.
Hobart et al., "Ultra-Cut: A Simple Technique for the Fabrication of SOI Substrates with Ultra-Thin (>5 nm) Silicon Films," IEEE International SOI Conference, 1998. Proceedings, Stuart, FL, USA, Oct. 5-8, 1998, New York, NY, USA, IEEE, US, Oct. 5, 1998, pp. 145-146.
Hulett et al., Ion Nitriding and Ion Implantation: A Comparison, Metal Progress, pp. 18-21 (1985).
I.B.M., Technical Disclosure Bulletin, vol. 29: No. 3, p. 1416 (Aug. 1986).
International Search Report and Written Opinion of PCT Application No. PCT/US07/78023, date of mailing Jul. 25, 2008, 13 pages total.
IQE's Smooth Approach Increases Carrier Mobilities, News, www.compoundsemiconductor.net, Dec. 2004.
Johnson et al., Hydrogen-Induced Platelets in Silicon: Separation of Nucleation and Growth, Mtrls. Sci. Forum, 83-87:33-38 (1992).
Krivokapic et al., "Strain Relaxation in Narrow Width Strained Silicon Devices with Poly and Metal Gates", Electrochemical Society Proceedings vol. 2004-07, pp. 459-469, Pennington, New Jersey USA (2004).
Lawn, Fracture of Brittle Solids, Second Edition, NIST Fellow, Cambridge University Press, pp. 1-13.
Lee et al., A Novel Pattern Transfer Process for Bonded SOI Giga-bit DRAMS, 1996 IEEE Int'l. SOI Conference Proceedings, IEEE Electron Devices Society, (1996.).
Lee et al., Strained Silicon Thin-Film Transistors Fabricated on Glass, Appl. Phys. Lett 86, 103504 (2005).
Li, Novel Semiconductor Substrate Formed by Hydrogen Ion Implantation into Silicon, Appl. Phys. Lett., 55(21):2223-2224 (1989).
Lu et al., SOI Material Technology Using Plasma Immersion Ion Implantation, Proceedings 1996 IEEE International SOI Conference (Oct. 1996).
Mahajan et al., Principles of Growth and Processing Semiconductors, WCB McGraw-Hill, chapter 6, pp. 262-269. (1999).
Mantl et al. Enhanced Strain Relaxation of Epitaxial SiGe-Layers on Si(100) Improved by Hydrogen Implantation, Nuclear Instruments and Methods in Physics Research Section B, Jan. 1999, v. 147, Issue 1-4, p. 29-34.
Matsuda et al., Large Diameter Ion Beam Implantation System, Nuclear Instruments and Methods, B21:314-316 (1987).
Merriam Webster's Collegiate Dictionary, 10th Ed., p. 388.
Milnes et al., Peeled Film Technology for Solar Cells, pp. 338-341. (1975).
Moreau, Semiconductor Lithography, Principles, Practices, and Materials, Plenum Press (1988).
Moriceau et al., Hydrogen Annealing Treatment Used to Obtain High Quality SOI Surfaces, Proceedings of 1998 IEEE Int. SOI Conference, pp. 37-38 from conference held Oct. 5-8, 1998.
Morrison et al., Deposition of Micro-Crystalline Silicon using a Graphite Filament in the Hot Wire CVD Technique, J. Vac. Sci. Technol A19 (6), Nov./Dec. 2001, p. 2817.

Mukashev et al., Hydrogen Implantation into Silicon: Infra-Red Absorption Spectra and Electrical Properties, Institute of High Energy Physics, Academy of Sciences of the Kazakh SSR, Alma-Ata 1; 91, 509 (1985).

Onojima et al., Lattice Relaxation Process of AlN Growth on Atomically Flat 6H-SIC Substrate in Molecular Beam Epitaxy, Journal of Crystal Growth, North-Holland Publishing Co., Amsterdam, NL, v. 2370239, Apr. 2002, pp. 1012-1016.

Oshima et al., Defects in Si Irradiated with D-T neutrons, D and He Ions, J. Nuc. Mtrls., 179-181:947-950 (1991).

Picraux et al., Ion Implantation of Surfaces, Scientific American, 252(3):102-113 (1985).

Renier et al., A New Low-Energy Ion Implanter for Bombardment of Cylindrical Surfaces, Vacuum, 35(12):577-578 (1985).

Saenger et al., Amorphization/templated recrystallization Method for Changing the Orientation of Single-Crystal Silicon: An Alternative Approach to Hybrid Orientation Substrates, Appl. Phys. Lett. 87, 221911, 2005.

Sato et al., Suppression of Si Etching During Hydrogen Annealing of Silicon-on-Insulator, Proceedings of 1998 IEEE Int. SOI Conference, pp. 17-18 from conference held Oct. 5-8, 1998.

Sherman et al., Energy Considerations in Crack Deflection Phenomenon in Single Crystal Silicon, International Journal of Fracture, vol. 140, Nos. 1-4, 2006 , pp. 125-140(16).

Sioshansi, Ion Beam Modification of Materials for Industry, Thin Solid Film, 118:61-71 (1984).

Smith, Thin Film Deposition, McGraw-Hill Inc., pp. 185-196, 278-293. (1995).

Sze, VLSI Technology, 2nd Edition, pp. 9-101, (1988).

Tate et al., Defect Reduction of Bonded SOI Wafers by Post Anneal Process in H/sub 2/Ambient, Proceedings of 1998 IEEE Int. SOI Conference, pp. 141-142 from conference held Oct. 5-8, 1998.

Thompson, Strained Silicon MOSFETs: The Next Material Change to Extend Moore's Law, University of Florida, Spring MRS 2004.

Tong et al., A Smarter-cut approach to low temperature silicon layer transfer, Appl. Phys. Lett., 72(1): 49-51 (1998).

Tong et al., Semiconductor Wafer Bonding: Science and Technology, John Wiley & Sons, Inc., pp. 152-171 (1999).

U.S. Dept. Of Energy, The Fusion Connection, Plasma Coating. (1985).

Veldkamp et al., Binary Optics, Scientific American, pp. 50-55 (May 1992).

Weldon et al., On the Mechanism of the Hydrogen-Induced Exfoliation of Silicon, J. Vac. Science Tech. B, 15(4), Jul./Aug. 1997.

Wolf et al., Silicon Processing for the VLSI Era vol. 1—Process Technology, pp. 547-549, 1986 by Lattice Press, Sunset Beach, California, ISBN 0-961672-3-7, Reprinted with corrections Jun. 1987.

Wolf et al., Silicon Processing for the VLSI Era vol. 1—Process Technology, p. 139, 1986 by Lattice Press, Sunset Beach, California, ISBN 0-961672-3-7, Reprinted with corrections Jun. 1987.

Wolf, Silicon Processing for the VLSI Era vol. 2, pp. 66-79, Lattice Press (1990).

Wu et al., From Incident Laser Pulse to Residual Stress: A Complete and Self-closed Model for Laser Shock Peening, Feb. 2007. ,Journal of Manufacturing Science & Engineering, vol. 129, pp. 117-125.

Wu et al., Two dimensional hydrodynamic simulation of high pressures induced by high power nanosecond laser-matter interactions under water, Journal of Applied Physics, vol. 101, Issue 10, pp. 103514-103514-8 (2007).

Yaguchi et al., Strain Relaxation in MBE-Grown Sl1-SGEX/SU (100) Heterostructures by Annealing, Japanese Journal of Applied Physics, Tokyo, JP, v. 30, No. 8B Part 2, Aug. 1991, pp. L1450-L1453.

Yamada et al., Thermal Damage of Silicon Wafer in Thermal Cleaving Process With Pulsed Laser and CW Laser, Laser-based Micropackaging, edited by Friedrich G. Bachmann, Willem Hoving, Yongfeng Lu, Kunihiko Washio, Proc. of SPIE vol. 6107, 61070H, (2006).

Yang et al., High Performance CMOS Fabricated on Hybrid Substrate with Different Crystal Orientations, IEDM Tech. Dig., 2003, pp. 453-456.

Yang et al., On the Integration of CMOS with Hybrid Crystal Orientations, 2004 Symposium on VLSI Technology Digest of Technical Papers, 2004.

Yun et al., Study on the Etching Reaction of Silicon with Carbon Tetrafluoride in Electron Cyclotron Resonance Plasma Etching System, Journal of the Korean Institute of Chemical Engineers, Jun. 1993, pp. 255-262, Hwahak Konghak vol. 32, No. 3.

Zhang et al., Microscale Laser Shock Peening of Thin Films, Part 1: Experiment, Modeling and Simulation, vol. 126, No. 1, Feb. 2004, pp. 10-17.

Zheng et al., Orientation dependence of blistering in H-implanted Si, Department of Electrical and Computer Engineering, University of California, San Diego, La Jolla, California 92093-0407 , J. Appl. Phys. 89, 2972 (2001).

* cited by examiner

RACE TRACK CONFIGURATION AND METHOD FOR WAFERING SILICON SOLAR SUBSTRATES

CROSS-REFERENCE TO RELATED APPLICATION

The instant nonprovisional patent application claims priority to U.S. Provisional Patent Application No. 61/091,710, filed Aug. 25, 2008 and incorporated by reference in its entirety herein for all purposes.

BACKGROUND OF THE INVENTION

The present invention relates generally to technique including a method and a structure for forming substrates. More particularly, the present method and system provides a method and system using an accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human being have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon (i.e. polycrystalline silicon) and/or single crystal silicon materials. These materials are often difficult to manufacture. Polysilicon cells are often formed by manufacturing polysilicon plates. Although these plates may be formed effectively, they do not possess optimum properties for highly effective solar cells. Single crystal silicon has suitable properties for high grade solar cells. Such single crystal silicon is, however, expensive and is also difficult to use for solar applications in an efficient and cost effective manner. Additionally, both polysilicon and single-crystal silicon materials suffer from material losses during conventional manufacturing called "kerf loss", where the sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

Generally, thin-film solar cells are less expensive by using less silicon material but their amorphous or polycrystalline structure are less efficient than the more expensive bulk silicon cells made from single-crystal silicon substrates. These and other limitations can be found throughout the present specification and more particularly below.

From the above, it is seen that techniques for forming suitable substrate materials of high quality and low cost are highly desired.

BRIEF SUMMARY OF THE INVENTION

According to the present invention, techniques including a method and a structure for forming substrates are provided. More particularly, the present method and system provides a method and system using an accelerator process and a cleave process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a system for manufacturing free standing films from bulk work pieces. The system includes a racetrack structure being configured to transfer at least one work piece. The system further includes one or more accelerator-based ion implanters coupled to the racetrack structure via an end station. Each of the accelerator-based ion implanters is configured to introduce particles having an energy of greater than 1 MeV to implant into a surface of the work piece loaded in the end station to form a cleave region in the work piece. Additionally, the system includes one or more cleave modules coupled to the racetrack structure. Each of the cleave modules is configured to perform a cleave process to release a free standing film from the work piece along the cleave region. Furthermore, the system includes an output port coupled to the cleave module to output the free standing film that is detached from the work piece and one or more service modules each connected to the racetrack structure.

In another specific embodiment, the present invention provides a method for volume manufacturing free standing thickness of materials from bulk work pieces. The method includes providing a racetrack structure including a first conveyor. The method further includes loading at least a work piece in a tray. The work piece has a surface substantially in a predetermined crystallographic plane. Additionally, the method includes transferring the work piece in the tray to an end station coupled to the racetrack structure via the first conveyor. The method further includes generating an ionic particle beam by an implant subsystem coupled to the racetrack structure. The ionic particle beam is introduced to the surface of the work piece in the end station and implanted to a depth defining a cleave region. Furthermore, the method includes transferring the work piece in the tray via the first conveyor to a cleave module coupled to the racetrack structure. The work piece is treated by one or more thermal-mechanical processes to cleave a free standing thickness of material along the cleave region. Moreover, the method includes releasing the free standing thickness of material having a thickness substantially equal to the depth and transferring the free standing thickness of material out of the cleave module via a second conveyor. In one embodiment, the racetrack structure is a closed looped architecture for transferring the tray holding a remaining portion of the work piece and performing a repeated implant process in the implant subsystem and a next round of cleave process in the cleave module.

Numerous benefits are achieved over pre-existing techniques using embodiments of the present invention. In particular, embodiments of the present invention use a cost effective accelerator system and method for providing a high energy implant process for layer transfer techniques. Such accelerator system may include, but is not limited to, a Drift Tube linear accelerator technique, a Radio Frequency Quadrupole (commonly called RFQ), an electrostatic accelerator technique, or combinations of these, (for example, a RFQ combined with a Drift Tube Linac or a RFI (RF-Focused Interdigital) Linear Accelerator), cyclotron, and other suitable techniques. In a preferred embodiment, the accelerator provides an implantation process that forms a thickness of transferable material defined by a cleave plane in a donor substrate. The thickness of transferable material may be further processed to provide a high quality semiconductor material for application such as photovoltaic devices, 3D MEMS or integrated circuits, IC packaging, semiconductor devices, any combination of these, and others. In a preferred embodiment, the present method provides for single crystal silicon for highly efficient photovoltaic cells among others. In a preferred embodiment, the present method and structure use a low initial dose of energetic particles, which allows the process to be cost effective and efficient. Additionally, the present method and structure allow for fabrication of large area substrates. It will be found that this invention can be applied to make thin silicon material plates of the desired form factor (for example, 50 µm-200 µm thickness with an area size from 15 cm×15 cm to upwards of 1 m×1 m or more for polysilicon plates). In an alternative preferred embodiment, embodiments according to the present invention may provide for a seed layer that can further provide for layering of a hetero-structure epitaxial process. The hetero-structure epitaxial process can be used to form thin multi-junction photovoltaic cells, among others. Merely as an example, GaAs and GaInP layers may be deposited heteroepitaxially onto a germanium seed layer, which is a transferred layer formed using an implant process according to an embodiment of the present invention. In a specific embodiment, the present method can be applied successively to cleaving multiple slices from a single ingot, e.g., silicon boule. That is, the method can be repeated to successively cleave slices (similar to cutting slices of bread from a baked loaf) according to a specific embodiment. Of course, there can be other variations, modifications, and alternatives.

Depending upon the embodiment, one or more of these benefits may be achieved. These and other benefits may be described throughout the present specification and more particularly below.

DETAILED DESCRIPTION OF THE INVENTION

According to embodiments of the present invention, techniques including a method for forming substrates are provided. More particularly, embodiments according to the present invention provide a method to form a free standing thickness of material from a semiconductor work piece. In a specific embodiment, the free standing layer of material is provided using a plurality of high energy particles to cause a formation of a cleave plane in the semiconductor substrate. The method according to present invent invention can be used in a variety of application, including but not limited to semiconductor device packaging, photovoltaic cells, MEMS devices, and others.

Figure 1:
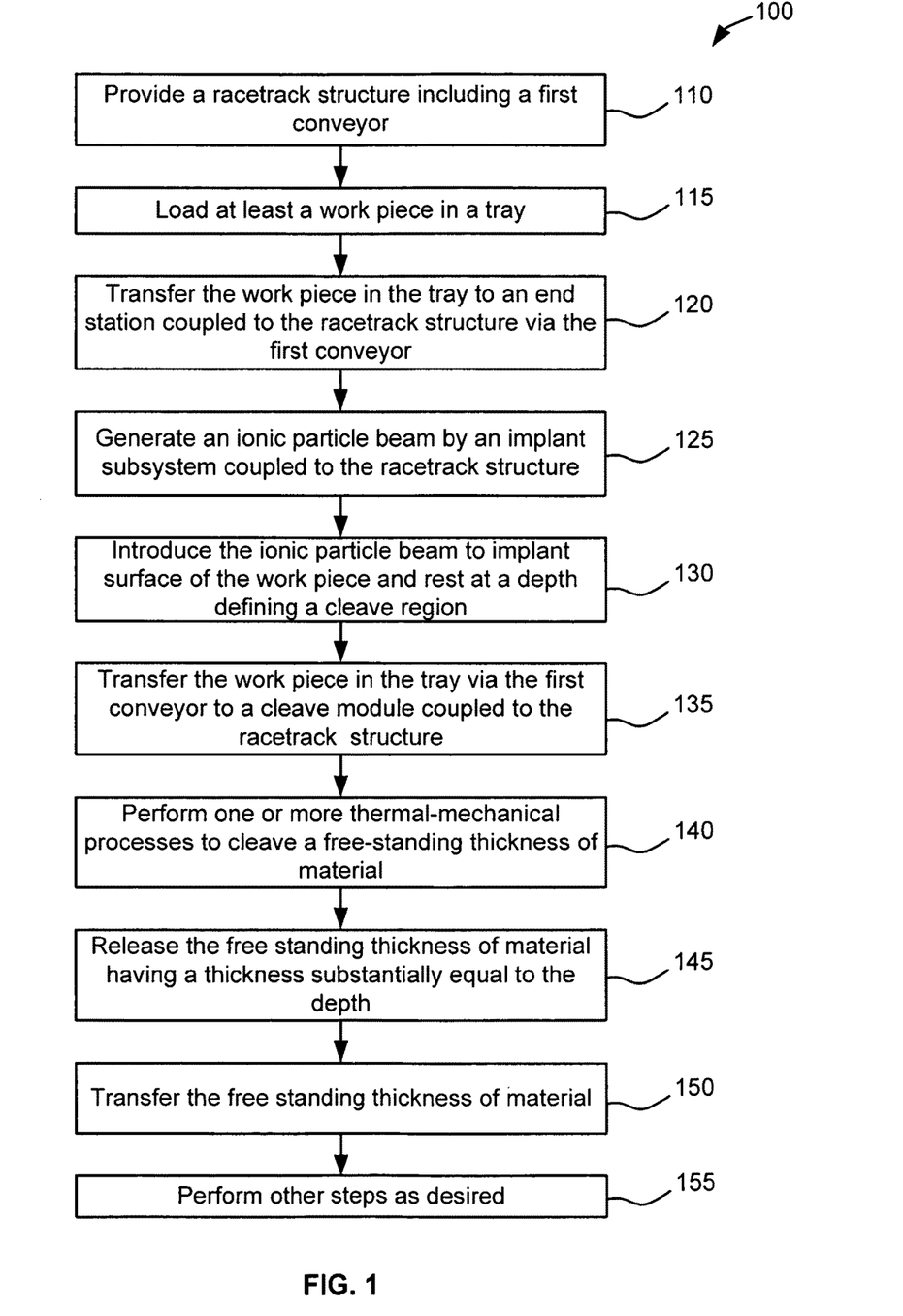
FIG. 1 is a simplified diagram illustrating a method of processing a film of material in a tool having a race track configuration according to an embodiment of the present invention.

FIG. 1 is a simplified diagram illustrating a method of processing a film of material in a tool having a racetrack configuration according to an embodiment of the present invention. In a specific embodiment, a method 100 for fabricating free standing thickness of materials from a semiconductor work piece in bulk form is provided as follows:

1. Process 110: Provide a racetrack structure including a first conveyor;
2. Process 115: Load at least a work piece in a tray;
3. Process 120: Transfer the work piece in the tray to an end station coupled to the racetrack structure via the first conveyor;
4. Process 125: Generate an ionic particle beam by an implant subsystem coupled to the racetrack structure;
5. Process 130: Introduce the ionic particle beam to implant surface of the work piece and rest at a depth defining a cleave region;
6. Process 135: Transfer the work piece in the tray via the first conveyor to a cleave module coupled to the racetrack structure;
7. Process 140: Perform one or more thermal-mechanical processes to cleave a free-standing thickness of material;
8. Process 145: Release the free standing thickness of material having a thickness substantially equal to the depth;
9. Process 150: Transfer the free standing thickness of material;
10. Process 155: Perform other steps as desired.

The above sequence of steps provide a method of forming substrates using an implantation process and a cleave process according to an embodiment of the present invention. As shown, the method 100 includes using an accelerator based high energy implant process and a controlled cleave process to remove a film of material, which is preferably thick and free standing using a system configured in a race track manner. Other alternatives can also be provided where steps may be added, one or more steps may be removed, or one or more steps may be provided in a different sequence without departing from the scope of the claims herein. Further details of the present method can be found throughout the present specific and more particularly below.

Briefly, the method 100 includes at least two major processes. The first major process is implantation process including at least the Processes 120 and 125, in which the surface of the work piece is exposed to an energetic particle beam. For example, the work piece is an ingot or boule of crystalline silicon with a surface prepared to be substantially within a specific crystallographic plane, e.g., an (111) or (110) plane with a miscut angle in a few degrees. The energetic particle beam can be a beam of light ions such as hydrogen which are accelerated to high energy of greater than 1 MeV via a corresponding high current high energy accelerator. The beam of ions then is directed and tuned to have a desired spot size and controllable scanning scheme via a magnetic beam scanner. As the beam of ions is introduced to the surface of the work piece, the ions come to rest in a thin layer at a well-defined depth below the surface of the work piece, defining a cleave region or cleave layer thereof. This cleave region or layer establishes a plane along which a mechanical facture will preferentially propagate. Details about techniques using accelerator based ion implantation and examples of the implant tools thereof can be found in U.S. patent application Ser. No. 11/936,582, U.S. Patent Application No. 60/997,684, and U.S. Patent Application No. 60/992,086, commonly assigned to Silicon Genesis Corporation of San Jose, Calif., and hereby incorporated by reference for all purposes. In one embodiment, the implantation process is performed within an implant subsystem coupled to a racetrack structure which is scalable and modular for coupling with other process or service modules. For example, a racetrack structure will be described in more detail in FIG. 2 below.

A second major process of the method 100 is the actual cleaving of the work piece or processing to cause a facture propagation to form a free standing thickness of material. This process, including at least Processes 140 through 150, is usually performed within a cleave module coupled to the racetrack structure and separated from the end station for implantation process. In particular, this process includes one or more thermal-mechanical treatments of the work piece which has been pre-implanted by the high energy ion beam with a well-defined cleave region. In one implementation, at least a localized initiation region at a defined depth has been formed beneath the surface of the work piece by implanting a beam of ions to a portion of the surface. The one or more thermal-mechanical treatments can be performed, at least starting from the initiation region, to initiate a facture locally. Further, the thermal-mechanical process is to cause the facture to subsequently propagate along the cleave region or layer, which is preferably close to a pre-defined crystallographic plane (such as (111) plane) due to a smaller cost of energy. Finally, the process results in separating a thin upper layer of the work piece from the remainder of the work piece. The thin upper layer is a monolithic, free standing thickness of material with a thickness substantially equal to the depth of the cleave layer. Through one or more extra steps, the free standing thickness of material can be released and transferred out of the cleave module via an output port. The released free standing thickness of material can be called a wafer that self-supporting and can be used as a wafer substrates for many applications including solar cells. Details about techniques of controlled cleaving a free standing thickness of materials and associated examples of the cleaving process tools can be found in U.S. Pat. No. 6,013,563 and U.S. Patent Application No. 61/051,344, U.S. Patent Application No. 61/051,307, commonly assigned to Silicon Genesis Corporation of San Jose, Calif., and hereby incorporated by reference for all purposes. Of course, there can be other variations, alternatives, and modifications.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

Figure 2:
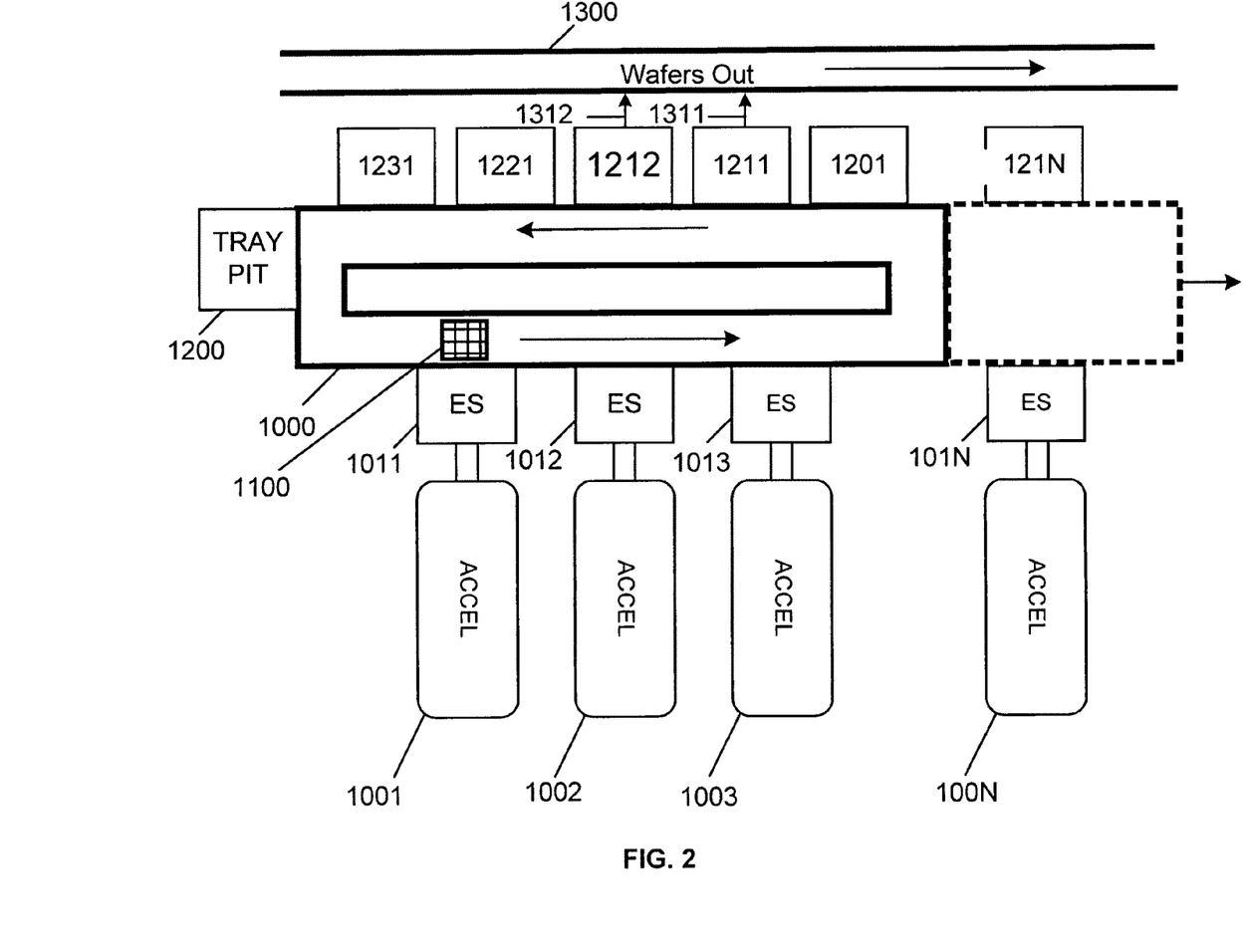
FIG. 2 is a simplified top-view diagram of a system and process in a race track configuration according to an embodiment of the present invention.

FIG. 2 is a simplified top-view diagram of a system and process in a racetrack configuration according to an embodiment of the present invention. This diagram is merely an example, which should not unduly limit the scope of the claims herein. As shown, a factory volume manufacture system is provided and configured in a racetrack structure 1000. The racetrack structure 1000 is illustrated specifically as a closed loop architecture. Of course, other forms such as linear single runway or multiple parallel runways architectures can be applicable. The racetrack structure inherently includes a track route and a factory conveyor can be built along with. A sample tray 1100 then is able to be installed onto the track route and transferable via this conveyor from one location to another. For example, the arrows within the track route illustrate the directions of the tray 1100 being transferred.

In one embodiment, a tray service module 1200 can be coupled to the racetrack structure 1000. The tray module 1200 can be used for stationing the sample tray 1100, where one or more work pieces can be loaded. In an implementation, the sample tray 1100 is designed to be able to carry multiple work pieces for maximizing the manufacture throughput. For example, the tray 1100 can have 6×6 pallets each seated a 156×156 mm ingots or can have 8×8 pallets each seated a 125×125 mm ingots. Each ingots can have a total height up to 100 mm. In one implementation, the throughput of each implant/cleave process pair is expected to range from 185 to 300 wafers per hour depending on wafer form factors. In an embodiment, more than one tray can be installed for increasing the production.

In another embodiment, the factory volume manufacture system includes one or more implant subsystems. Each of the implant subsystem includes an accelerator-based ion implanter (e.g. 1001) and an end station (e.g. 1011). The tray 1100 can be loaded into the end station 1011, which is a vacuum chamber and coupled to the accelerator 1001 for performing an implantation process to at least one work piece in the tray 1100.

The accelerator-based ion implanter 1001 is characterized as a high current, high energy ion beam accelerator and designed to produce a mono-energetic beam of protons or other light ions at energy greater than 1 MeV. In one example, a RFQ-based or RFI-based linear accelerator is used. In another example, a cyclotron accelerator is applied. In yet another example, an electrostatic accelerator can be used. Ion implant apparatuses useful for embodiments of the present invention have been made recently available by the use of DC electrostatic particle accelerators such as the DYNA-MITRON proton accelerator available from Ion Beam Applications SA, Belgium). Other forms of DC electrostatic accelerators which may be used include Van de Graaff or Tandem Van de Graaff accelerator types.

The proton beam generated by the accelerator 1001 is directed into the end station 1011 and tuned with a proper spot diameter and dose control. Within the end station 1011, the surfaces of the work pieces in the tray 1100 is exposed to the proton beam which can be scanned and pulsed to provide proper dosage across the surface area. The energetic ions then are implanted into the surface of each work piece and rest at a well-defined depth depending on the energy level of the beam, causing a formation of a stressed defective structure within a thin layer called a cleave region or cleave layer. In one implementation, there can be some additional implant subsystems being coupled to the racetrack structure 1000. For example, another implant subsystem includes an accelerator 1002 (or 1003, or 100N) and an end station 1012 (or 1013, or 101N) accordingly for performing similar implantation process to a separate tray holding at least one work piece.

Referring to FIG. 2 again, the racetrack structure 1000 also is configured to couple with several process or service modules along the track route. For example, one or more cleave module 1211, 1212, or 121N are directly coupled to the racetrack structure 1000. After the implantation process is performed within one of implant subsystems (described in last paragraph), the tray 1100 can be transferred via the conveyor into the cleave module 121 1. The cleave module 1211 includes tools for performing one or more thermal-mechanical treatments to the work pieces in the tray 1100. In particular, the thermal-mechanical treatments are applied and controlled to cause an initiation of mechanical fracture of the work piece near the cleave region and a subsequent controlled propagation along the cleave region. In one embodiment, the thermal-mechanical treatments cause a cleave process or a controlled facture propagation of a thin upper layer of a bulk work piece. The cleave process would lead to a formation and detachment of a complete free standing thickness of material or a free standing film or simply a thin wafer out of each work piece in the tray. In another embodiment, the number of the cleave modules associated with the racetrack structure 1000 can be increased, e.g., by adding redundant cleave modules 1212 through 121N, for achieving a balanced line production with a proper ratio over the number of installed implant subsystems within the same racetrack structure 1000.

Of course, there can be other alternatives, variations, and modifications for the system in the racetrack configuration. For example, the racetrack structure 1000 can be designed to couple with an annealing station 1201 where the work pieces in the tray 1100 can be thermally treated before loaded into the cleave module 1211. In another example, the racetrack structure 1000 can include an optional module 1221 for performing any necessary steps after the formation of the free standing thickness of material. In certain embodiments, each cleave module, e.g., 1211 or 1212, may include an output port 1311 or 1312 for transferring the free standing thickness of material after its detachment. The free standing thickness of material can be firstly inspected, and then boxed, or directly placed on a second conveyor 1300 associated with the racetrack structure 1000. In a specific embodiment, the racetrack structure may also include a quality control (QC) module 1231 for performing quality inspection for a remaining portion of each work piece in the tray 1100 after removing a free standing thickness of material thereof. The QC module 1231 may also be able to performing necessary work piece re-preparation including surface smoothening process to make each work piece ready for a repeated implant/cleave process. In particular, the tray 1100 carrying the work pieces can be transferred again into one of end stations 1011 through 101N for next round of implantation process. The details of a method for manufacturing a film of material subsequently in a tool having a racetrack configuration can be seen in FIG. 1 described above.

Figure 3:
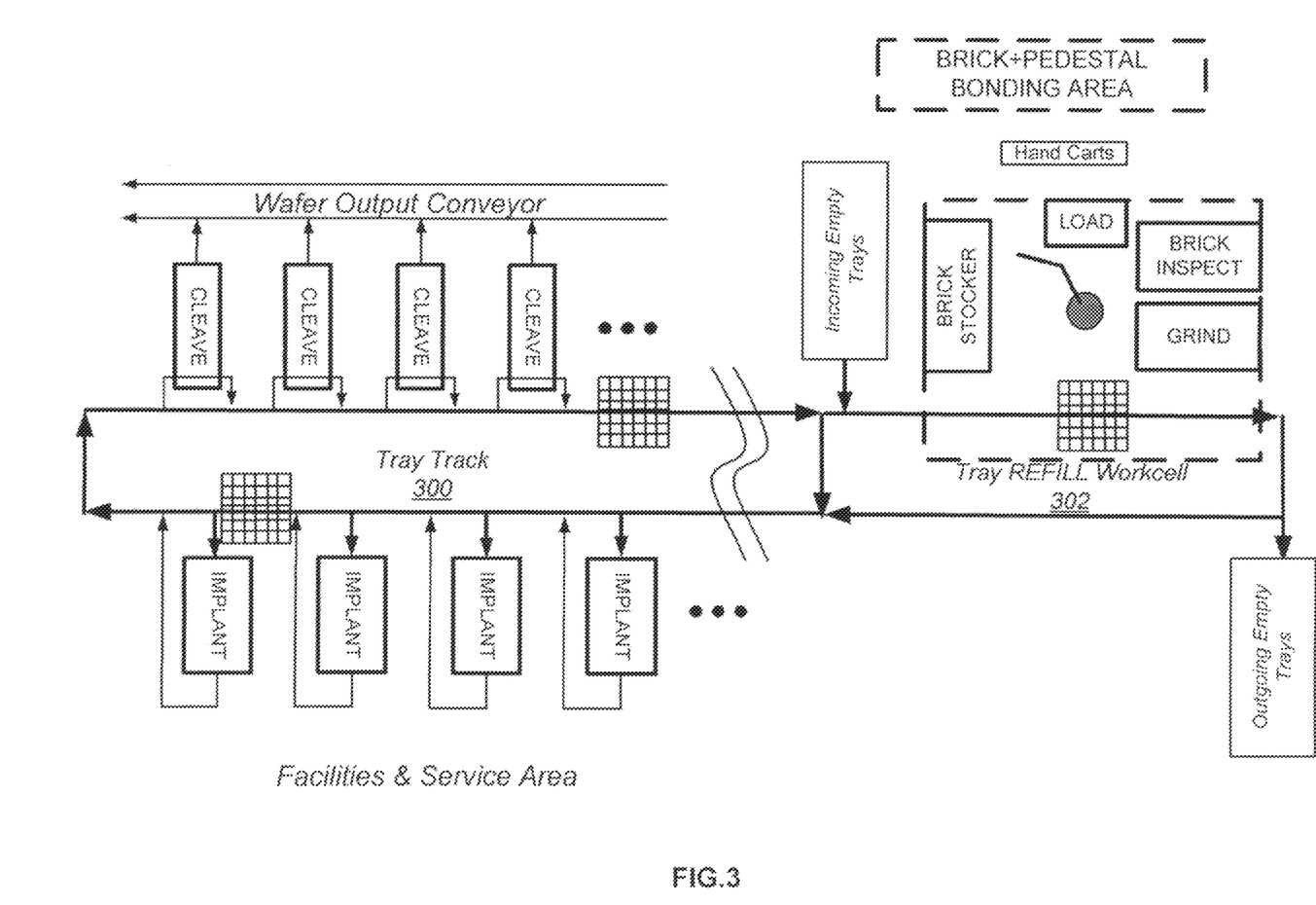
FIG. 3 is a simplified top-view diagram of a system employing two race tracks in communication with one another.

Alternative embodiments fall within the scope of the present invention. For example, FIG. 3 shows a simplified schematic diagram of an embodiment utilizing a race track having more than one loop. A first loop 300 of the racetrack is utilized to receive and circulate trays bearing work pieces between implant stations and cleave stations. Following cleaving, wafers are output to a conveyor.

A second loop 302 of the race track is used to refill trays with bricks, once successive implantation and cleaving steps have reduced the amount of material present in an existing brick. The second race track is also in communication with various stations, such as a load lock, a brick inspection node, a brick grinding node, and a brick stocking point.

While the embodiments of FIGS. 2 and 3 show a closed-loop architecture, this is not required. According to alternative embodiments, a single runway architecture may be employed.

Figure 4:
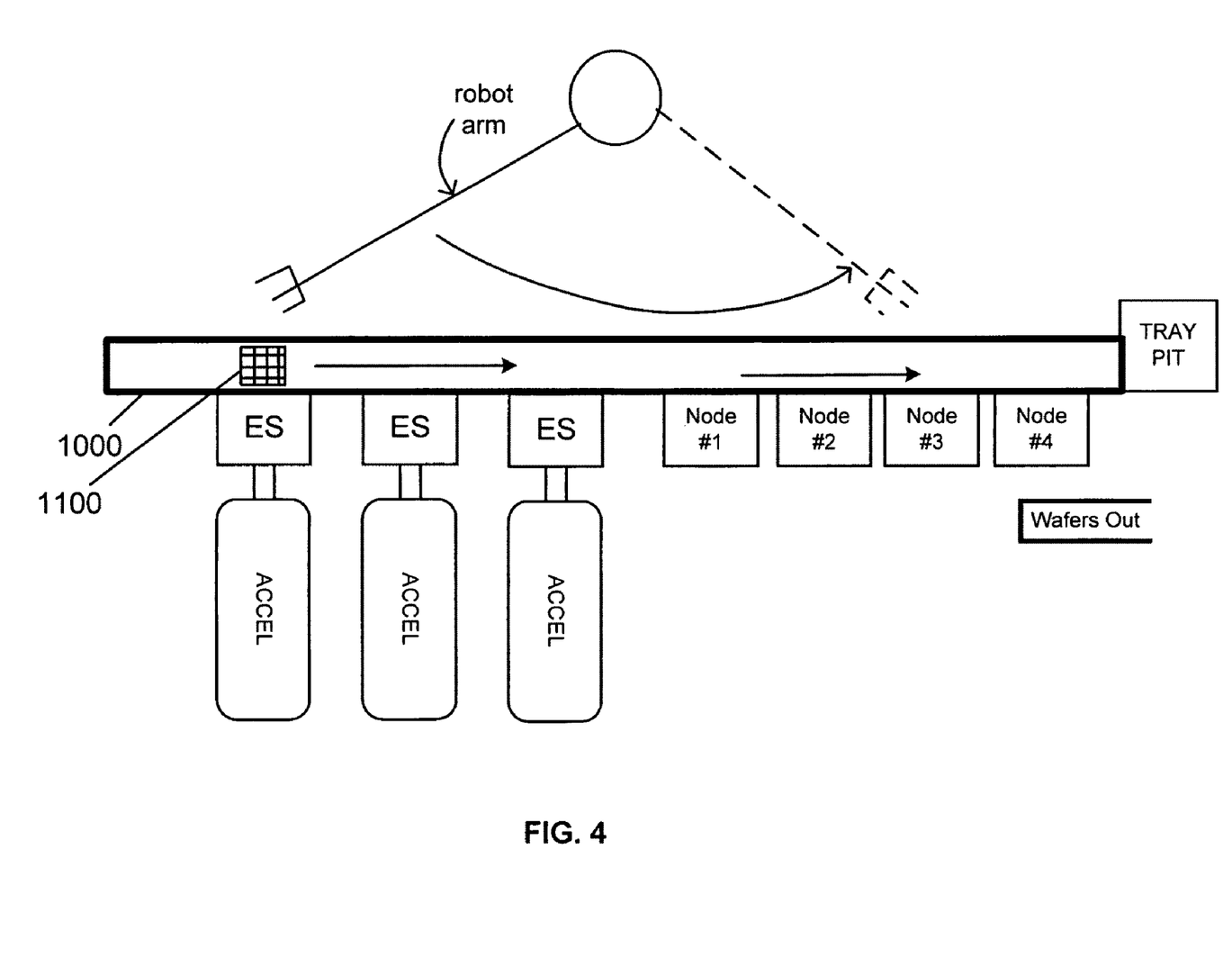
FIG. 4 is a simplified top-view diagram of a system employing a runway type architecture.

FIG. 4 shows one such alternative embodiment utilizing a runway configuration. In this embodiment, a single, linear conveyor 400 transports work pieces 402 (which may be supported on trays), for exposure to implantation in the end-station of one or more linear accelerators. The conveyor also is in communication with various other nodes, for example cleave modules or service modules that may be used for analysis or processing of wafers/substrates or the bricks.

Following cleaving, a robot 404 may be employed to transport bricks from regions near the end of the conveyor to the beginning of the conveyor. This transport would allow for implantation of the bricks in order to cleave additional material. In certain embodiments, the robot may be a track robot (shown) or may be an Automated Guide Vehicle (AGV).

And while the previous embodiments show systems having one or more conveyor structures, this is not required by the present invention. Alternative embodiments could use structures other than conveyors for movement of the trays/bricks/substrates. One example of alternative ways of moving these elements could utilize track-based robots. Another example of alternative ways of moving these elements could utilize AGVs.

Figure 5:
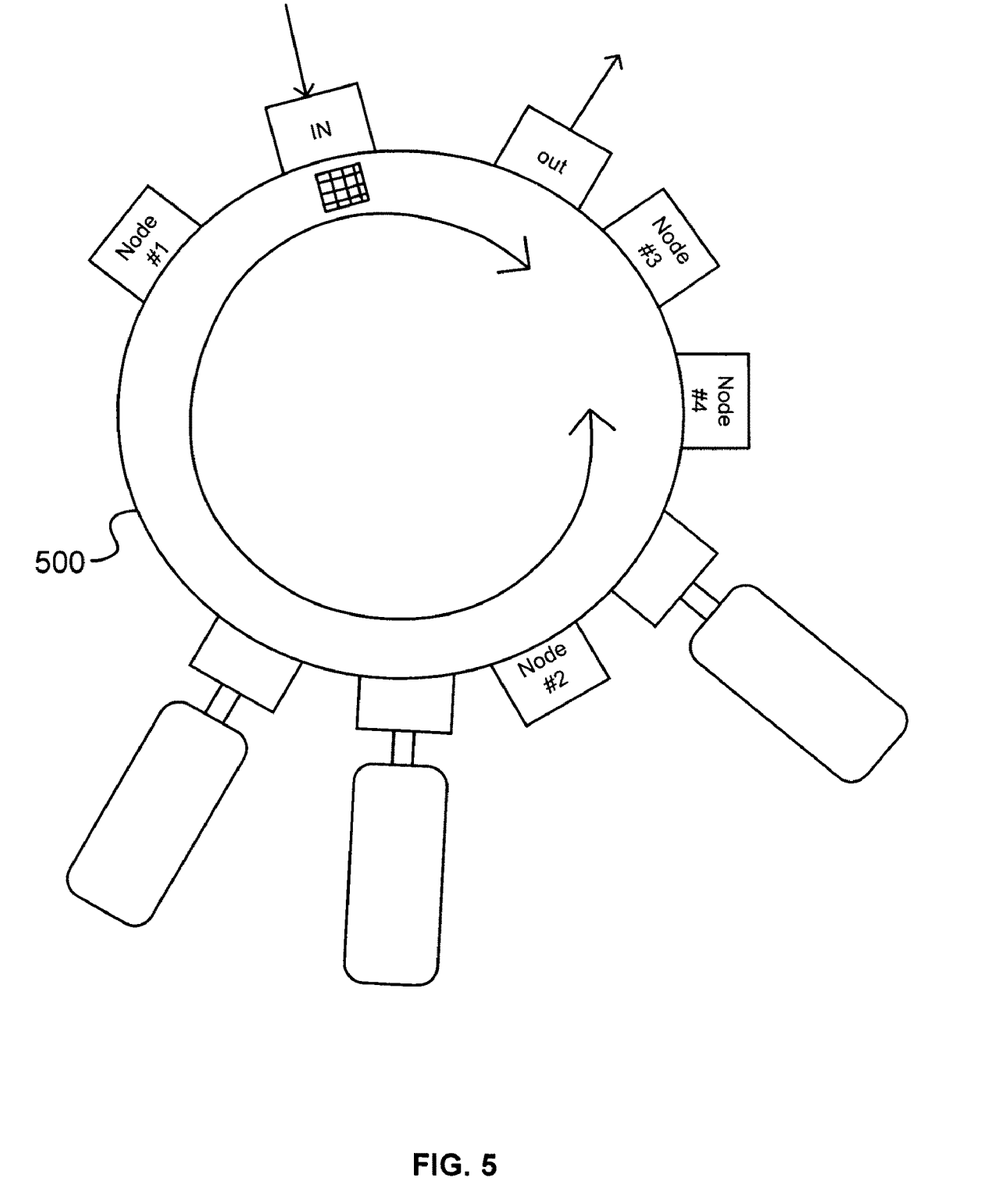
FIG. 5 is a simplified top-view diagram of a system employing a rotating platen rather than conveyor belts, for movement of trays, bricks, or substrates.

Still another example of an alternative embodiment employs a rotating lazy susan-type structure to accomplish movement. As shown in the embodiment of FIG. 5, a circular platform 500 is configured to rotate to allow bricks/trays present thereon, to be in communication with different implantation stations or analysis processing nodes. The circular platform is also in communication with input and output nodes allowing successive loading and unloading of trays/bricks/cleaved substrates.

The following nonprovisional patent applications are incorporated by reference in their entireties herein for all purposes: U.S. Nonprovisional patent application Ser. No. 11/782,289, and U.S. Nonprovisional patent application Ser. No. 11/784,524.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions to allow for formation of the cleave plane with a modified dose and/or cleaving properties according to alternative embodiments. In other embodiments, the work piece can be one or more silicon boules and/or waters, and the like. In other embodiments, the work piece can be configured with a slight miscut or be spatially angled with or without miscuts. Of course there can be other variations, modifications, and alternatives. Therefore, the above description and illustrations should not be taken as limiting the scope of the present invention which is defined by the appended claims.

What is claimed is:

1. A system for manufacturing free-standing films from bulk work pieces, the system comprising:
   a racetrack structure being configured to transfer at least one work piece;
   one or more accelerator-based ion implanters coupled to the racetrack structure via an end station, each of the accelerator-based ion implanters being configured to introduce particles to implant into a surface of the work piece loaded in the end station to form a cleave region in the work piece;
   one or more cleave modules coupled to the racetrack structure, each of the cleave modules being configured to perform a cleave process to release a free-standing film from the work piece along the cleave region, whereupon following release of the free-standing film from the work piece, the work piece is returned to the end station for introduction of more particles; and
   one or more service modules each connected to the racetrack structure;
   wherein the one or more service modules include a quality control station for inspecting and preparing the work piece to be used for repeated implantation and cleave processes.

2. The system of claim 1 further comprising an output port coupled to the cleave module to output the free standing film that is detached from the work piece.

3. The system of claim 1 wherein the one or more service modules include a tray service module for loading one or more work pieces to a supporting tray, and performing a maintenance to the tray.

4. The system of claim 1 wherein the one or more service modules include an anneal station for performing thermal treatment before or after a cleave process in the one or more cleave modules.

5. The system of claim 1 wherein the at least one of the accelerator-based ion implanters is configured to introduce particles having an energy of greater than 1 MeV.

6. The system of claim 1 wherein the racetrack structure can be configured to be a closed loop architecture or a single runway architecture.

7. The system of claim 1 wherein the racetrack structure includes a first conveyor to transfer the at least one work piece in a tray from one location to another location, said another location including an end station, one of the one or more cleave modules, or one of the one or more service modules.

8. The system of claim 7 wherein the racetrack structure is scalable to extend the first conveyor and add additional process modules coupled thereto.

9. The system of claim 1 wherein the work piece is returned to the end station utilizing a track robot, a robotic arm, an automated guide vehicle, or a rotating platform.

10. The system of claim 1 further comprising a line balance for the racetrack structure with an adjustable ratio of a number of the one or more accelerator based ion implanters and a number of the one or more cleave modules.

11. A system for manufacturing free-standing films from bulk work pieces, the system comprising:
   a racetrack structure being configured to transfer at least one work piece;
   one or more accelerator-based ion implanters coupled to the racetrack structure via an end station, each of the accelerator-based ion implanters being configured to introduce particles to implant into a surface of the work piece loaded in the end station to form a cleave region in the work piece; and
   one or more cleave modules coupled to the racetrack structure, each of the cleave modules being configured to perform a cleave process to release a free-standing film from the work piece along the cleave region, whereupon following release of the free-standing film from the work piece, the work piece is returned to the end station for introduction of more particles;
   wherein the one or more accelerator-based ion implanters comprises a RFQ-based linear accelerator, a QFI-based linear accelerator, a cyclotron accelerator, or an electrostatic accelerator for producing particles having energy up to about 5 MeV.

12. The system of claim 11 wherein the particles include hydrogen ions or other light ions with either positive charges or negative charges.

13. The system of claim 11 wherein the work piece can be a boule of crystalline silicon and the surface can be selected to be along crystallographic (111) or (110) plane with a small miscut angles of a few degrees and square or pseudo-square cross-sectional shape.

14. The system of claim 11 wherein the one or more cleave modules further comprise tools for irradiating and scanning using an electronic-magnetic process to the work piece and performing a cleaving process.

15. A method for volume manufacturing free standing thickness of materials from bulk work pieces, the method comprising:
   providing a racetrack structure including a first conveyor;
   loading at least a work piece in the conveyor, the work piece having a surface substantially in a predetermined crystallographic plane;
   transferring the work piece to an end station coupled to the racetrack structure via the first conveyor;
   generating an ionic particle beam by an implant subsystem coupled to the racetrack structure, the ionic particle beam being introduced to the surface of the work piece in the end station and implanted to a depth defining a cleave region;
   transferring the work piece via the first conveyor to a cleave module coupled to the racetrack structure, the work piece being treated by one or more processes to cleave a free standing thickness of material along the cleave region;
   releasing the free standing thickness of material having a thickness substantially equal to the depth;
   returning the work piece to the end station;
   transferring the free standing thickness of material out of the cleave module via a second conveyor; and
   transferring the free standing thickness of material to a QC module and performing inspection of the work piece within the QC module, the QC module being coupled to the racetrack structure.

16. The method of claim 15 wherein the loading at least a work piece in a tray is performed in a tray service module coupled to the racetrack structure.

17. The method of claim 15 wherein the tray is a platen comprising a plurality of pallets each being configured to hold one work piece with an mechanism to adjust relative surface angle and relative height.

18. The method of claim 15 wherein the racetrack structure can be configured to be a closed loop architecture or a single runway architecture.

19. The method of claim 15 wherein generating an ionic particle beam by the implant subsystem comprises using an accelerator to produce the ionic particle beam having an energy of a few MeV, redirecting the ionic particle beam to the end station, and using a magnetic scanner to scan the ionic particle beam.

20. The method of claim 15 wherein the depth defining the cleave region depends on an combination of energy level and dosage of the ionic particle beam.

21. The method of claim 15 further comprising annealing the work piece within an annealing module coupled to the racetrack structure before it is transferred to the cleave module via the first conveyor.

22. The method of claim 15 wherein the work piece is loaded in the conveyor supported on a tray.

23. The method of claim 15 wherein the work piece is returned to the end station utilizing a conveyor, a track robot, a robotic arm, an automated guide vehicle, or a rotating platform.

* * * * *